United States Patent
Kim et al.

(10) Patent No.: US 10,393,788 B2
(45) Date of Patent: Aug. 27, 2019

(54) APPARATUS AND METHOD FOR DIAGNOSING STATE OF POWER CABLE AND MEASURING REMAINING LIFE THEREOF USING VLF TD MEASUREMENT DATA

(71) Applicants: KOREA ELECTRIC POWER CORPORATION, Seoul (KP); MOKPO NATIONAL MARITIME UNIVERSITY INDUSTRY-ACADEMIC COOPERATION FOUNDATION, Jeollanam-Do (KR)

(72) Inventors: Sung-Min Kim, Seoul (KR); Dongsub Kim, Gyeonggi-do (KR); Si Sik Jeon, Seoul (KR); Byung-Suk Kim, Seoul (KR); Jangsub Im, Gwangju (KR)

(73) Assignees: Korea Electric Power Corporation, Seoul (KR); Mokpo National Maritime University Industry-Academic Cooperation Foundation, Jeollanam-Do (KR)

( * ) Notice: Subject to any disclaimer, the term of this patent is extended or adjusted under 35 U.S.C. 154(b) by 224 days.

(21) Appl. No.: 14/787,686

(22) PCT Filed: Aug. 27, 2014

(86) PCT No.: PCT/KR2014/007965
§ 371 (c)(1),
(2) Date: Oct. 28, 2015

(87) PCT Pub. No.: WO2016/006756
PCT Pub. Date: Jan. 14, 2016

(65) Prior Publication Data
US 2016/0161541 A1 Jun. 9, 2016

(30) Foreign Application Priority Data

Jul. 9, 2014 (KR) .................. 10-2014-0085889

(51) Int. Cl.
*G01R 31/02* (2006.01)
*G06F 17/18* (2006.01)
(Continued)

(52) U.S. Cl.
CPC ....... *G01R 31/021* (2013.01); *G01R 31/1272* (2013.01); *G06F 17/18* (2013.01); *G01R 27/2688* (2013.01)

(58) Field of Classification Search
None
See application file for complete search history.

(56) References Cited

U.S. PATENT DOCUMENTS 5,150,059 A * 9/1992 Bognar ............... G01R 31/12
324/546
2003/0001119 A1 1/2003 Takezawa et al.
(Continued)

FOREIGN PATENT DOCUMENTS

| CN | 102944777 A | 2/2013 |
| CN | 103558534 A | 2/2014 |

(Continued)

OTHER PUBLICATIONS

IEEE Guide for Field Testing of Shielded Power Cable Systems Using Very Low Frequency (VLF), IEEE Std 400.2™-2004, dated Mar. 8, 2005. (Year: 2005).*

(Continued)

*Primary Examiner* — J. H. Hur
(74) *Attorney, Agent, or Firm* — Morgan, Lewis & Bockius LLP

(57) ABSTRACT

An apparatus and method for diagnosing the state of a power cable and measuring the remaining life thereof using VLF
(Continued)

TD measurement data, and for determining a replacement time of a power cable using a 3D matrix exhibiting reproducibility of diagnosis of the state of the power cable. The apparatus and method for diagnosing the state of a power cable and measuring the remaining life thereof according to the present invention includes a Weibull modeling unit, a distance limiting unit, a data type classifying unit, a quantity representing unit, a normalization unit, a 3D constructing unit, a risk level calculating unit, and a remaining life measuring unit.

18 Claims, 22 Drawing Sheets

(51) Int. Cl.
*G01R 31/12* (2006.01)
*G01R 27/26* (2006.01)

(56) References Cited

U.S. PATENT DOCUMENTS

| | | | | |
|---|---|---|---|---|
| 2005/0007122 | A1* | 1/2005 | Oertel | G01R 31/021 324/543 |
| 2013/0106451 | A1* | 5/2013 | Scheuschner | G01R 31/00 324/750.01 |
| 2014/0347070 | A1* | 11/2014 | Scheuschner | G01R 31/08 324/543 |

FOREIGN PATENT DOCUMENTS

| | | |
|---|---|---|
| EP | 1970718 A2 | 9/2008 |
| GB | 2426090 A | 11/2006 |
| JP | H08201455 A | 8/1996 |
| JP | H09304467 A | 11/1997 |
| JP | 2000-206093 A | 7/2000 |
| JP | 2003-014621 A | 1/2003 |
| JP | 2007-298287 A | 11/2007 |
| JP | 2011-183557 A | 9/2011 |
| KR | 10-1223883 B1 | 1/2013 |
| KR | 10-1330091 B1 | 11/2013 |
| KR | 10-1367891 B1 | 2/2014 |

OTHER PUBLICATIONS

Search Report issued in European Patent Application No. 14889786.1., dated Jul. 7, 2017.
Kim, Dongsub et al., "A study on three dimensional assessment of the aging condition of polymeric medium voltage cables applying very low frequency(VLF) tan [delta] diagno" IEEE Transactions on Dielectrics and Electrical Insulation, IEEE Service Center, Piscataway, NJ, US, vol. 21, No. 3, Jun. 1, 2014 (Jun. 1, 2014), pp. 940-947.
Perkel, J. et al.,"Interpretation of dielectric loss data on service aged polyethylene based power cable systems using VLF test methods", IEEE Transactions on Dielectrics and Electrical Insulation, IEEE Service Center, Piscataway, NJ, US, vol. 20, No. 5, Oct. 1, 2013 (Oct. 1, 2013), pp. 1699-1711.
Kim, Sung-Min et al., "The estimation of insulation on MV cables using the VLF tan diagnostic measurement", Condition Monitoring and Diagnosis (CMD), 2012 International Con Ference on, IEEE, Sep. 23, 2012 (Sep. 23, 2012), pp. 1191-1196.
Hernandez-Mejia, J. C. et al.,"Correlation between tan [delta] diagnostic measurements and breakdown performance at VLF for MV XLPE cables", IEEE Transactions on Dielectrics and Electrical Insulation, IEEE Service Center, Piscataway, NJ, US, vol. 16, No. 1, Feb. 1, 2009 (Feb. 1, 2009), pp. 162-170.
Kim, Sung-Min et al., "The influence estimation of aging factor in MV cable using Weibull distribution and Neural Networks", 2012 IEEE International Converence on Condition Monitoring and Diagnosis (CMD), Sep. 23, 2012 (Sep. 23, 2012), pp. 1223-1226.
International Search Report and Written Opinion received in International Application No. PCT/KR2014/007965, which is the National Phase Application under 35 U.S.C. § 371 to the current application.
D. Kim et al., "A Study on Three Dimensional Assessment of the Aging Condition of Polymeric Medium Voltage Cables Applying Very Low Frequency (VLF) tan Diagnostic", IEEE Transactions on Dielectrics and Electrical Insulation, vol. 21, No. 3, pp. 940-947, published in Jun. 11, 2014.
Chinese Office Action issued in corresponding Chinese Patent Application No. 201480027475.8, dated Jan. 22, 2018, with English Translation.
Japanese Office Action issued in corresponding Japanese Patent Application No. 2016-533260, dated Mar. 20, 2018, with English Abstract.

* cited by examiner

| Condition Assessment | Mean VLF TD at $U_o[10^{-3}]$ | | Differential VLF-TD at $1.5U_o$-$0.5U_o$ $[10^{-3}]$ | | VLF-TD Stability (measured by standard deviation) at $U_o$ |
|---|---|---|---|---|---|
| No Action Required | < 4 | or | < 4 | or | < 0.05 |
| Further Study Advised | 4 to 50 | | 5 to 80 | | 0.05 to 0.5 |
| Action Required | > 50 | | > 80 | | > 0.5 |

FIG. 1

PRIOR ART

APPARATUS AND METHOD FOR DIAGNOSING STATE OF POWER CABLE AND MEASURING REMAINING LIFE THEREOF USING VLF TD MEASUREMENT DATA

CROSS-REFERENCE

This application is the U.S. National Phase under 35 U.S.C. § 371 of International Application No. PCT/KR2014/007965, filed Aug. 27, 2014, which claims the benefit of Korean Application No. 10-2014-0085889, filed Jul. 9, 2014, the entire contents of each are hereby incorporated by reference.

TECHNICAL FIELD

The present invention relates, in general, to an apparatus and method for diagnosing the state of a power cable and measuring the remaining life thereof using very long frequency (VLF) tangent delta (tan δ or TD) measurement data, and more particularly, an apparatus and method for diagnosing the state of a power cable and measuring remaining life by diagnosing the state of a power cable using VLF TD measurement data, creating a 3D matrix having improved reproducibility of diagnosis of the state of the power cable, and measuring the remaining life of the power cable using data that is a statistical reinterpretation of the VLF TD measurement data.

BACKGROUND ART

Generally, a VLF TD measuring method in a power system is the most representative method for measuring a TD change in cables or power facilities with various kinds of applied voltages to diagnose abnormal signs such as the occurrence of water trees or gaps in an insulator.

When a water tree occurs inside an insulator that has run for a long time, a degradation phenomenon occurs, which includes a decrease in insulation resistance and an increase in loss current. This phenomenon is represented as a TD change, and whether an abnormality is present and the state of degradation are determined by measuring the amount of this change. In particular, since a high voltage insulator has very high insulation resistance and capacitance, a leakage current and voltage exhibit a phase difference of 90°. However, this is a theoretical conclusion appearing in an ideal state circuit. In reality, a slight deviation occurs due to a resistance component inside the insulator, and at this point, the phase angle deviation of voltage-current is represented as TD. In other words, a large numerical TD value indicates the occurrence of an abnormality.

As the foregoing method of measuring TD, there is a measurement method according to a Schering bridge principle and a measurement method using the minute phase difference between voltage and current as disclosed in Japanese Patent Application Laid-Open Publication No. 1996-201455. At this point, the TD measuring method using the phase difference normally employs a VLF signal of about 0.1 Hz. The reason is that whether the water tree is present may not be easily diagnosed with a TD value change at practical commercial frequency of 60 Hz, but may be diagnosed only with a TD value change at a VLF of 0.1 Hz or lower.

However, since the method for measuring TD using VLF determines a state of degradation based on a simple comparison between a certain reference value or level value and a measured value, there are limitations in that since there is no statistical background, an individual country's environmental conditions, which include a ratio of underground cable installment, rainfall, flood characteristics, management state, cable type, and development characteristics, are not considered.

In addition, the method for measuring TD using VLF does not suggest clear determination criteria, such as numerical reproducibility, and lacks standardization for application to the field. FIG. 1 shows new determination criteria of VLF TD proposed by IEEE in 2010, which are greater determination values compared to the previous ones. At this point, since, as measurement factors depending on the cable type, a standard deviation for a measurement condition of 1 Uo is added by a logical OR operation, a state determination range is set wide, from 4 to 50, which causes much confusion.

In addition, since the method for measuring TD using VLF relies on techniques from advanced European countries, there are limitations in that since accurate determination of the cause of occurrence of VLF TD is not possible, it is difficult to actively respond to facility failure or facility malfunctions, such as insulation breakdown, and accordingly facility reliability is lower under various field conditions.

DISCLOSURE

Technical Problem

The present invention has been proposed to solve the limitations and has the object of providing an apparatus and method for diagnosing the state of a power cable and measuring the remaining life thereof using VLF TD measurement data, which is capable of diagnosing the state of the power cable using the VLF TD measurement data and measuring the remaining life using a 3D matrix, with the aim of realizing reproducible diagnosis of the state of the power cable.

In addition, the present invention has the object of providing an apparatus and method for diagnosing the state of a power cable and measuring the remaining life thereof using the VLF TD measurement data, which is capable of deducing causes influencing VLF TD signal characteristics by classifying VLF TD signals by each type of degradation or structural modification of a power cable.

In addition, the present invention has the object of providing an apparatus and method for diagnosing the state of a power cable and measuring the remaining life thereof using the VLF TD measurement data, which is capable of accurately and easily diagnosing the state of a power cable by converting, to a distance to a position vector, a normalized distance from an original point determined as a start point of degradation that power cable management is required, to a specific degradation point in the 3D matrix.

In addition, the present invention has the object of providing an apparatus and method for diagnosing the state of a power cable and measuring the remaining life thereof using VLF TD measurement data, which is capable of measuring the remaining economic life of a power cable by calculating at least any one of a cost of power cable replacement work, reference failure probability, position matched with failure density according to the reference failure probability, degradation speed, margin rate, allowance rate, failure reliability level, and fault determination distance.

Technical Solution

In accordance with an aspect of the present invention to accomplish the above object, there is provided an apparatus for diagnosing the state of a power cable and measuring the remaining life thereof. The apparatus includes: a Weibull modeling unit performing Weibull distribution modeling by accumulating VLF tan delta (TD) signal data measured for each of a plurality of voltage levels applied to a power cable; a distance limiting unit comparing a Weibull distribution for accumulated VLF TD signal data with a preset Weibull distribution for the accumulated VLF TD signal data for each measurement distance to limit the measurement limit distance; a data type classifying unit classifying the VLF TD signal data for each type on the basis of the limited measurement limit distance; a quantity representing unit quantitatively representing the classified type; a normalization unit representing, to dispersion distributions, the VLF TD signal data and VLF TD signal deviation (DTD), and the VLF TD signal data and a slope of deviation (SKIRT) derived from the quantity representing unit, and normalizing the dispersion distributions to derive normalization distributions; a 3D constructing unit constructing a 3D matrix with the derived normalization distributions; and a risk level calculating unit calculating a risk level of the power cable as one of preset risk levels on the basis of the distance measured in the 3D matrix.

The data type classifying unit may classify the VLF TD signal data into trends and patterns, trends may be largely classified into linear and non-linear types, linear patterns may be classified into positive, negative, and constant types, and non-linear patterns may be classified into an oscillating type.

The quantity representing unit includes: a virtual line function representing unit generating a virtual line connecting a maximum value and a minimum value among the VLF TD signal data; a virtual line standard deviation deriving unit deriving a virtual standard deviation $STDEV_{virtual}$ for the generated virtual line and the VLF TD signal data; a correction variable deriving unit deriving a correction variable for correcting the derived virtual line standard deviation and the VLF TD signal data; and a SKIRT deriving unit deriving a SKIRT by multiplying the derived correction variable by a virtual line slope;

The correction variable deriving unit may correct a fitting degree of numerical values of the VLF TD signal data to the virtual line and a quantitative level of the VLF TD signal data.

The normalization unit may derive a normalization distribution for normalizing values of X- and Y-axes of the dispersion distribution of the VLF TD signal data and DTD, and values of X- and Y-axes of the dispersion distribution of the VLF TD signal data and SKIRT into normalized values of 0 to 1.

The 3D constructing unit may construct the 3D matrix with an X-axis taken as normalized VLF TD data, a Y-axis taken as a normalized DTD, and a Z-axis taken as a normalized SKIRT.

The risk level calculating unit may calculate the distance to a specific position vector (x, y, z) from the coordinates (0, 0, 0) of an original point of the 3D matrix, and calculates a risk level of the power cable on the basis of the calculated result.

The preset risk level may be classified and set to a plurality of risk levels in correspondence to a present distance range.

The apparatus may further include a life measuring unit measuring the remaining life of the power cable on the basis of the 3D matrix.

The remaining life measuring unit may calculate at least any one of a cost of power cable replacement work, reference failure probability, position matched with a failure density according to the reference failure probability, degradation speed, margin rate, allowance rate, failure reliability level, and fault determination time to measure the remaining life of the power cable.

In accordance with another aspect of the present invention to accomplish the above object, there is provided a method for diagnosing the state of a power cable and measuring the remaining life thereof. The method includes: performing Weibull distribution modeling by accumulating VLF tan delta (TD) signal data measured for each of a plurality of voltages applied to a power cable; comparing a Weibull distribution for accumulated VLF TD signal data with a preset Weibull distribution for the accumulated VLF TD signal data for each measurement distance to limit the measurement limit distance; classifying the VLF TD signal data for each type on the basis of the limited measurement limit distance; quantitatively representing the classified type; representing the VLF TD signal data and DTD, and, the VLF TD signal data and a SKIRT, as dispersion distributions, and normalizing the dispersion distributions to derive normalization distributions; constructing a 3D matrix with the derived normalization distributions; and calculating a risk level of the power cable as one of preset risk levels on the basis of a distance measured in the constructed 3D matrix.

The classifying of the VLF TD signal data into trends and patterns may include largely classifying the trend into linear and non-linear types, classifying the linear pattern into positive, negative, and constant types, and classifying the non-linear pattern into an oscillating type.

The quantitatively representing the classified type may include: generating a virtual line connecting a maximum value and a minimum value among the VLF TD signal data; deriving a virtual standard deviation $STDEV_{virtual}$ for the generated virtual line and the VLF TD signal data; deriving a correction variable for correcting the derived virtual line standard deviation and the VLF TD signal data; and deriving a SKIRT by multiplying the derived correction variable by a virtual line slope.

The representing the VLF TD signal data and DTD, and, the VLF TD signal data and a SKIRT, as dispersion distributions, and normalizing the dispersion distributions to derive normalization distributions may include deriving a normalization distribution for normalizing X- and Y-axes of the dispersion distribution of VLF TD signal data and the DTD, and the dispersion distribution of the VLF TD signal data and the SKIRT into normalized values of 0 to 1.

The constructing the 3D matrix with the derived normalization distributions may include constructing the 3D matrix with an X-axis taken as a normalized VLF TD data, a Y-axis taken as a normalized VLF TD signal deviation, and a Z-axis taken as a normalized SKIRT.

The calculating the risk level of the power cable as one of preset risk levels on the basis of a distance measured in the constructed 3D matrix may include calculating a distance to a specific position vector (x, y, z) from coordinates (0, 0, 0) of an original point of the 3D matrix, and calculating a risk level of the power cable on the basis of the calculated result.

The method may further include measuring the remaining life of the power cable on the basis of the 3D matrix, after the calculating the risk level of the power cable as one of preset risk levels on the basis of the distance measured in the constructed 3D matrix.

The measuring the remaining life of the power cable on the basis of the 3D matrix may include calculating at least any one of a cost of power cable replacement work, reference failure probability, position matching with the failure density according to the reference failure probability, degradation speed, margin rate, allowance rate, failure reliability level, and fault determination time to measure the remaining life of the power cable.

Advantageous Effects

In accordance with the present invention having the above configuration, an apparatus and method for diagnosing the state of a power cable and measuring the remaining life thereof using VLF TD measurement data may present a statistical basis for a cable degradation determination and a logical basis of a probability distribution by diagnosing the state of a power cable using a VLF TD signal.

In addition, there are effects of predicting the remaining life of a power cable and predicting the time of occurrence of failure based on statistical probability by measuring the remaining life of the power cable using a 3D matrix in which the reproducibility of diagnosis of the state of the power cable is realized.

In addition, there is an effect of deducing a cause influencing the characteristics of a VLF TD signal by classifying the VLF TD signal by each type of degradation or structural modification of a power cable.

In addition, there is an effect of accurately and easily diagnosing the state of a power cable on the basis of the distance from an original point that a degradation acceleration of the power cable may be predicted to a position vector at a specific position in the 3D matrix.

In addition, there is an effect of establishing determination criteria for determining economic-based facility replacement by measuring the remaining economic life of a power cable by calculating at least any one of a cost of power cable replacement work, reference failure probability, position matching with the failure density according to the reference failure probability, degradation speed, margin rate, allowance rate, failure reliability level, and fault determination distance.

DESCRIPTION OF DRAWINGS

FIG. 1 is a table representing a new determination criterion for VLF TD proposed by IEEE in 2010;

BEST MODE

Figure 2:
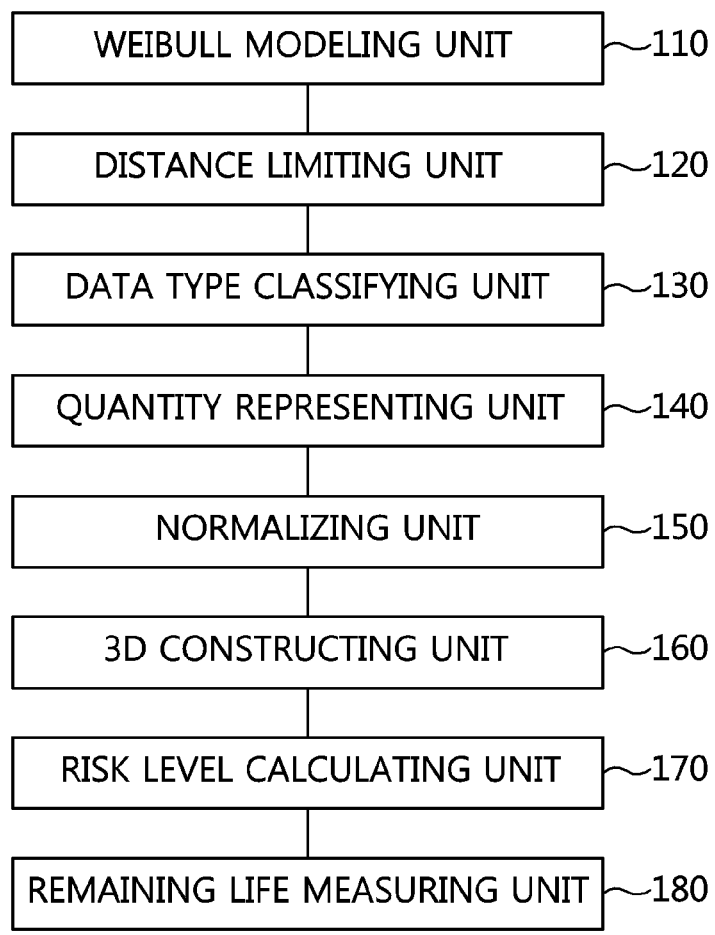
FIG. 2 is a view illustrating the configuration of an apparatus for diagnosing the state of a power cable and measuring the remaining life thereof using VLF TD measurement data.

Hereinafter, embodiments of the present invention will be described in detail with reference to the accompanying drawings so that the present invention can be easily realized by those skilled in the art. Initially, it should be noted that like reference numerals refer to like constituent elements, although they are illustrated in different drawings. Further, in the description of the present invention, when it is determined that the detailed description of the related functions and constructions would obscure the gist of the present invention, the description thereof will be omitted.

Hereinafter, embodiments of an apparatus and method for diagnosing the state of a power cable and measuring the remaining life thereof using VLF TD measurement data will be described in detail with reference to the accompanying drawings.

FIG. 2 is a view illustrating the configuration of an apparatus 100 for diagnosing the state of a power cable and measuring the remaining life thereof using VLF TD measurement data.

Referring to FIG. 2, the apparatus 100 for diagnosing the state of a power cable using VLF TD measurement data according to the present invention largely includes a Weibull modeling unit 110, a distance limiting unit 120, a data type classifying unit 130, a quantity representing unit 140, a normalizing unit 150, a 3D configuring unit 160, a risk level calculating unit 170, and a remaining life measuring unit 180.

The Weibull modeling unit 110 performs Weibull distribution modeling by accumulating VLF TD signal data measured for each of a plurality of voltage levels applied to a power cable.

At this point, the various voltage levels applied to the power cable are in the range of 0.5 Uo to 1.5 Uo, and in the present invention, the VLF TD data is extracted using voltage levels corresponding to 0.5 Uo, 1.0 Uo, and 1.5 Uo. At this point, a maximum voltage level may be set to 1.5 Uo and a minimum voltage level may be set to 0.5 Uo.

In addition, a normal operating voltage of the power cable is represented with a phase to phase voltage. In other words, a so-called 22.9 kV level is the phase to phase voltage in a domestic main distribution line. However, since the voltage between a ground and a conductor is a basic voltage, about 13.2 kV is a measurement reference voltage in the domestic case, and this is defined as 1 Uo in the VLF TD measurement. Accordingly, since the transmission and distribution voltage levels are different for each country, Uo is a reference level for a basic application voltage level.

The distance limiting unit 120 limits the measurement distance by comparing a Weibull distribution of accumulated VLF TD signal data and a preset Weibull distribution of VLF TD signal data accumulated for each measurement distance. The distance limiting unit 120 compares and analyzes, for each measurement distance, the Weibull distributions for about 20,000 Km of line owned by Korea electronic power corporation (KEPCO). This may represent an accumulated probability distribution function (PDF) using the Weibull distribution for 1.5 Uo VLF TD for each measurement distance, as illustrated in FIGS. 3 to 12, which will be described later.

Figure 13:
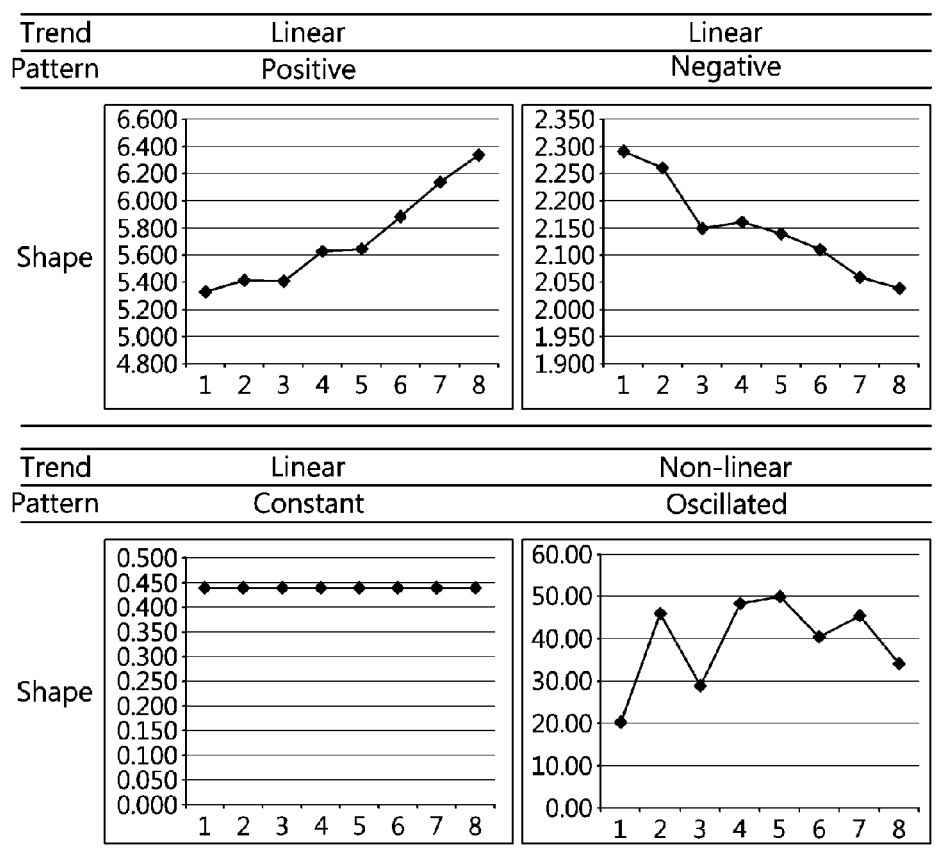
FIG. 13 is a view illustrating data types classified by the data type classifying unit employed in the present invention.

The data type classifying unit 130 classifies the VLF TD signal data on the basis of the limited measurement limit distance. The data type classifying unit 130 classifies the VLF TD signal data into trends and patterns, and the trends are further classified into linear and non-linear types and the patterns are also further classified into positive, negative, constant, and oscillating types. This may classify the VLF TD signal into trends and patterns, as illustrated in FIG. 13.

The quantity representing unit 140 represents the classified type in a quantitative manner. This has the configuration illustrated in FIG. 14, and will be described in detail later.

The normalization unit 150 represents, as a dispersion distribution, the VLF TD signal data and the deviation of the VLF TD signal (DTD), and the VLF TD signal data and SKIRT derived from the quantity representing unit 140, and normalizes the dispersion distribution to derive a normalization distribution. In other words, the normalization unit 150 derives the normalization distribution in which values of X- and Y-axes of the dispersion distribution of the VLF TD signal data and DTD, and values of X- and Y-axes of the dispersion distribution of the VLF TD signal data and SKIRT are normalized to have values ranging from 0 to 1. This is represented as illustrated in FIGS. 16A, 16B, 17A, and 17B, to be described later.

The reason for normalizing in this way is because the data distribution is extensively applicable to a specific cable type or a voltage class. However, in the case where an application range is different therefrom or a cable is another type, when currently owned data is normalized through a statistical distribution analysis, a cable manager may represent it in an identical category from 0 to 1.

Accordingly, the present invention proposes a qualitative area that is extensively applicable to a distribution of another cable type. In other words, an area where the power cable needs management is set and all data distributions inside the area are normalized from 0 to 1. This is for analyzing data by an expert group and delivering it to an operator who may easily know about the area, instead of making respective criteria for specific TD values. In other words, a data distribution is allowed to be in the range from 0 to 100% in order for the operator to easily perform a determination in the field. For example, when a TD value of 1.5 Uo means 'an A type cable is 10*10−3[ABU] and a B type cable is 6*10−3[ABU]', it is practical to convert them to respective relative quantitative values, namely, 0.2 (20%) and 0.8 (80%) instead of suggesting different reference values. Accordingly, a new reference value for a data group less than existing accumulated KEPCO data may also be rapidly set through the normalization conversion.

Figure 18:
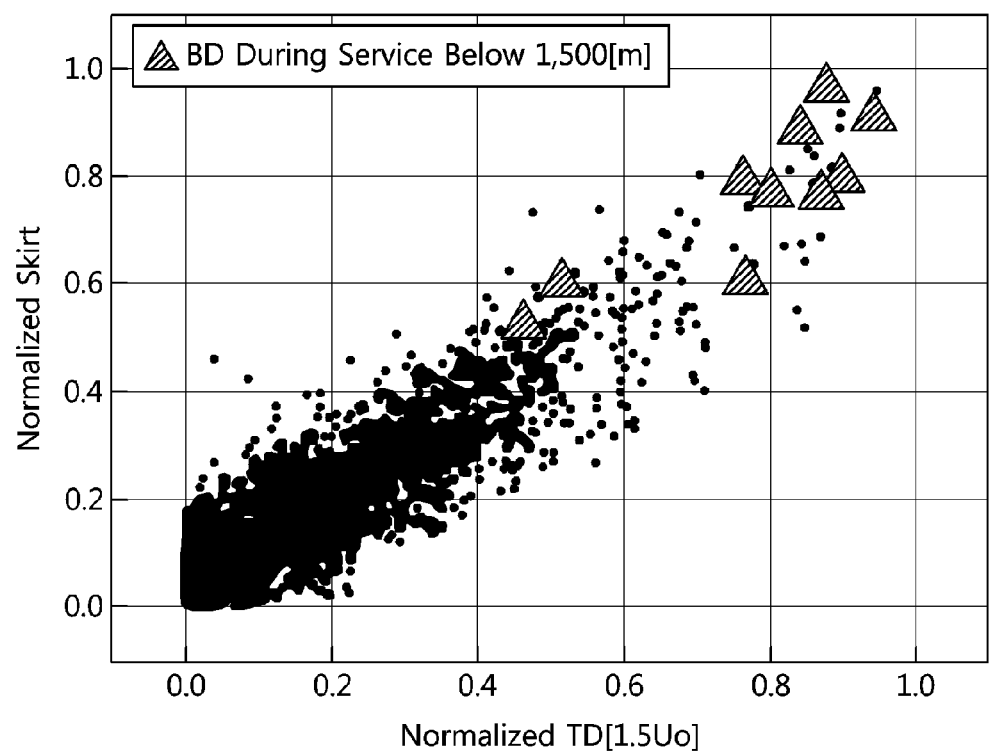
FIG. 18 is a normalized distribution according to the VLF TD signal data and VLF TD signal deviation, which is derived through the normalizing unit employed in the present invention.

The 3D configuring unit 160 constructs a 3D matrix with the derived normalization distribution. The 3D configuring unit constructs the 3D matrix with an X-axis taken for VLF TD data, a Y-axis taken for a DTD, and a Z-axis taken for a normalized SKIRT. This may be represented as illustrated in FIG. 18, to be described later.

The risk level calculating unit 170 maps a risk level of a power cable to one of preset risk levels on the basis of a distance measured in the 3D matrix. The risk level calculating unit 170 calculates a distance $R=\sqrt{x^2+y^2+z^2}$ from coordinates (0, 0, 0) of an original point of the 3D matrix to a specific position vector (x, y, z) and calculates the risk level of the power cable on the basis of the calculated result. At this point, the preset risk levels are classified and set to a plurality of risk levels in correspondence to preset distance ranges.

The remaining life measuring unit 180 measures the remaining life of the power cable on the basis of the 3D matrix. The remaining life measuring unit 180 calculates at least any one of the cost of power cable replacement work, reference failure probability, position matching with the failure density according to the reference failure probability, degradation speed, margin rate, allowance rate, failure reliability level, and fault determination time, and measures the remaining life.

FIGS. 3 to 12 are view illustrating an accumulative probability density function (PDF) using a Weibull distribution for VLF TD signal data accumulated for a preset measurement distance in the distance limiting unit employed in the present invention.

Figure 3:
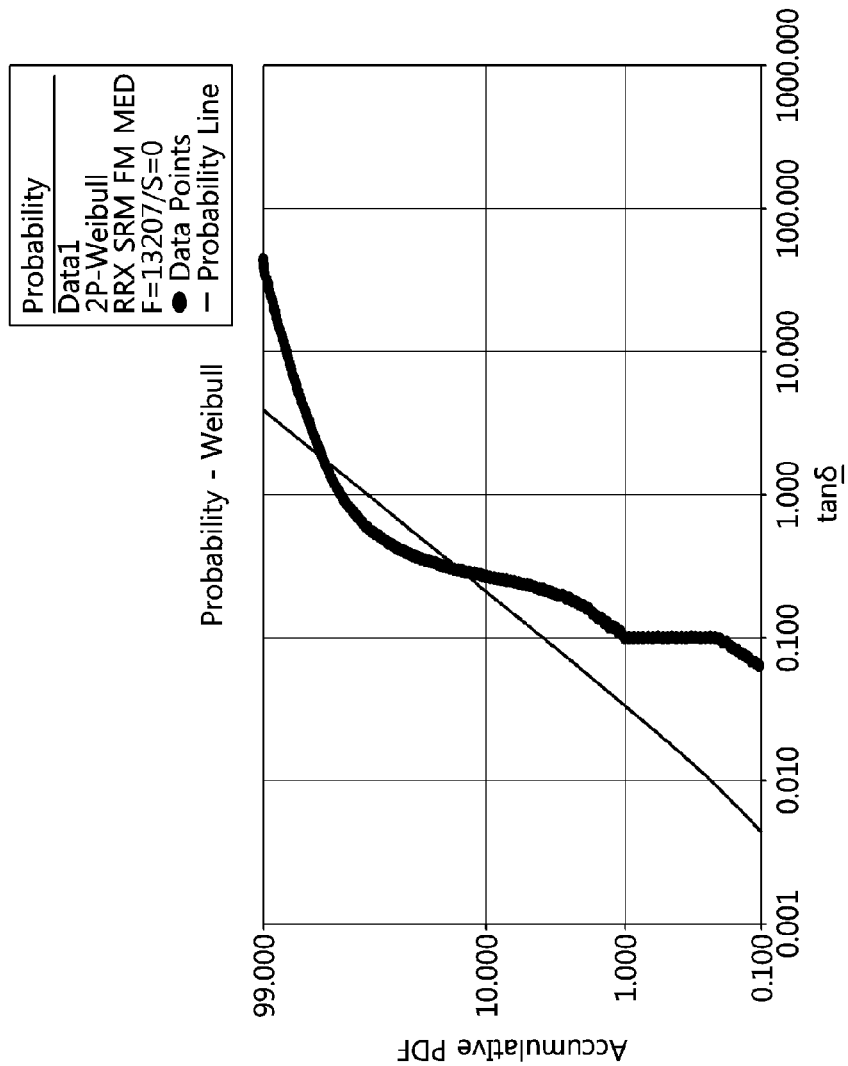
FIGS. 3 to 12 are views illustrating an accumulative probability density function (PDF) obtained using a Weibull distribution for VLF TD signal data accumulated for a preset measurement distance in a distance limiting unit employed in the present invention.
Figure 4:
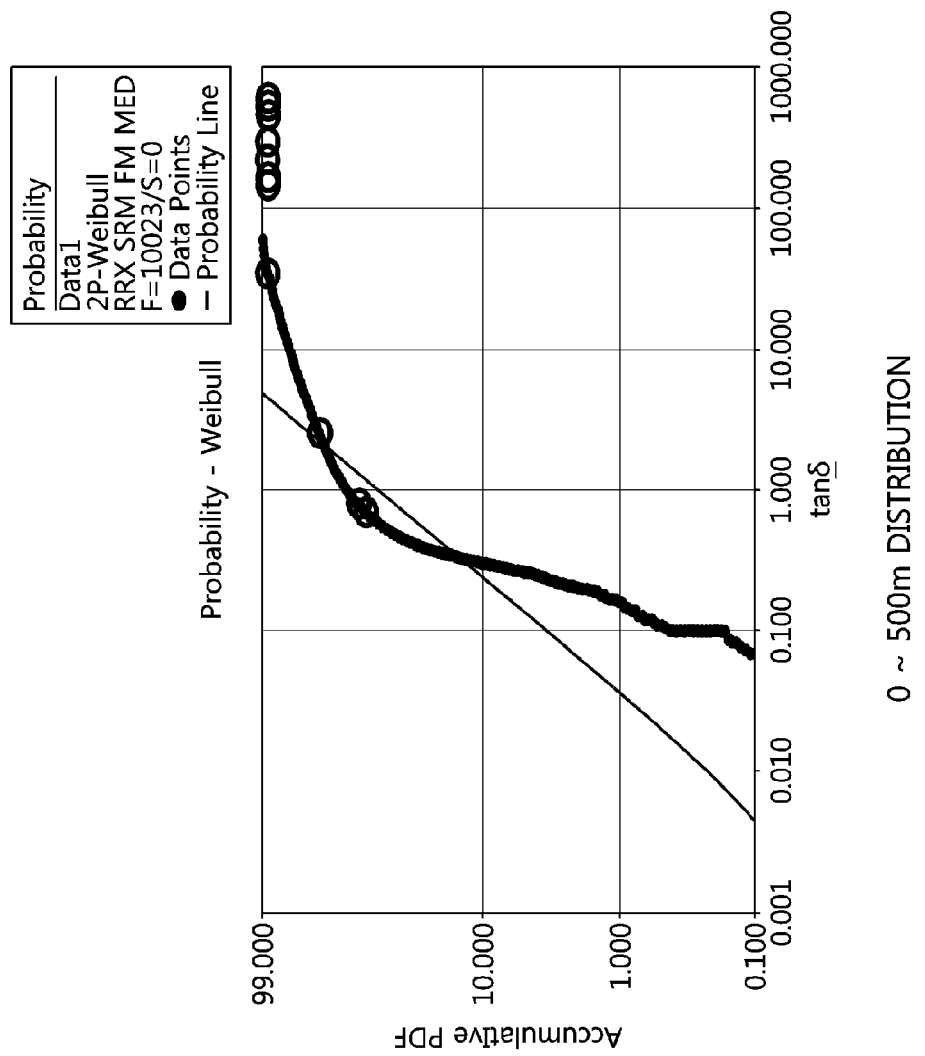
Figure 5:
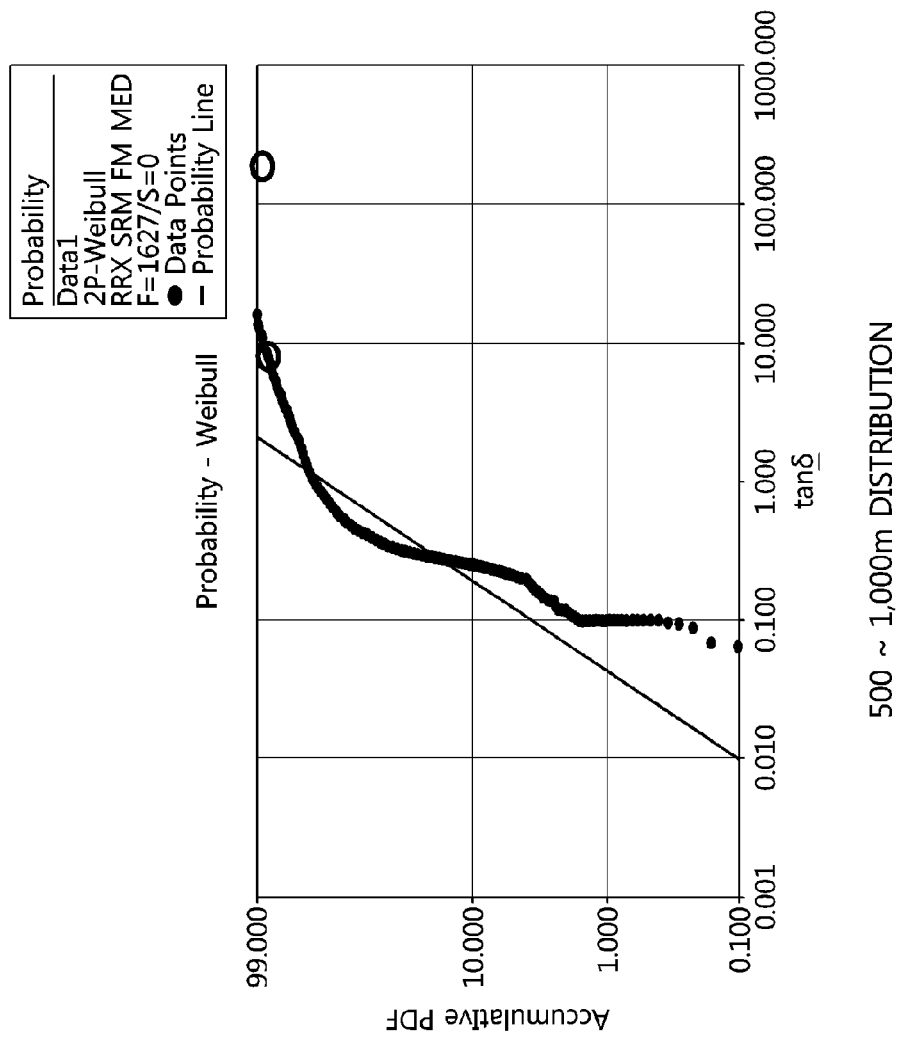
Figure 6:
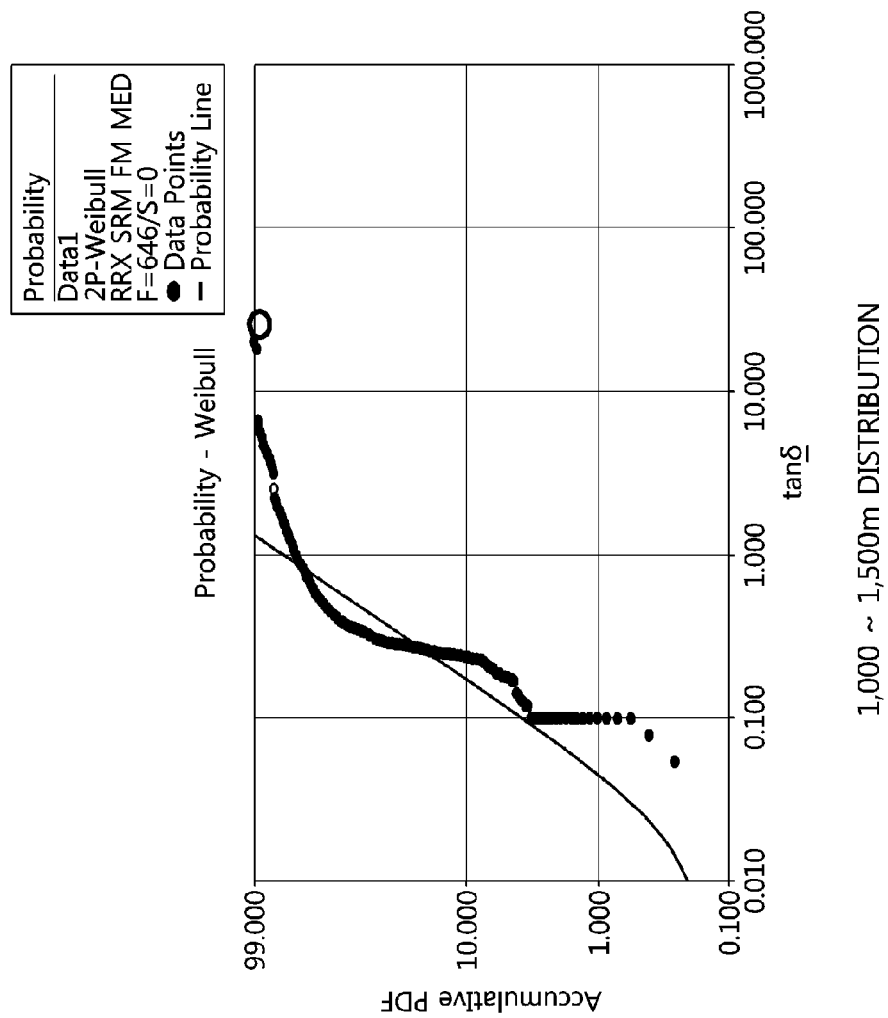
Figure 7:
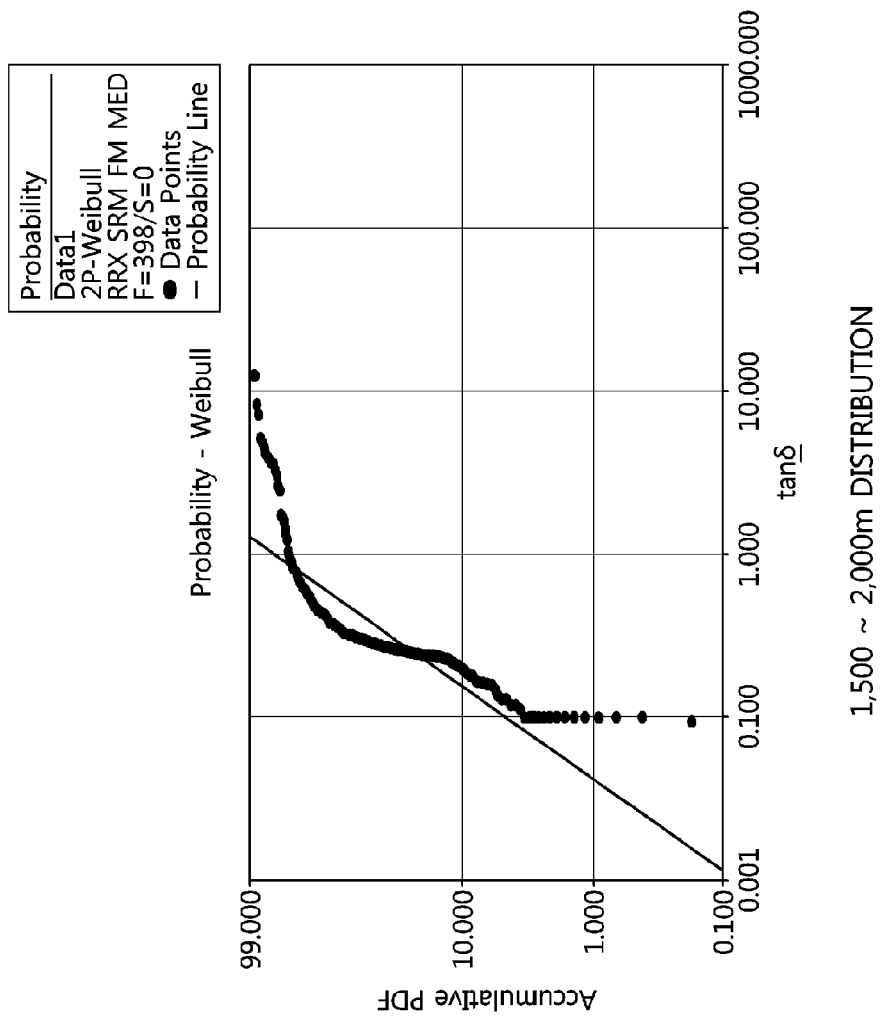
Figure 8:
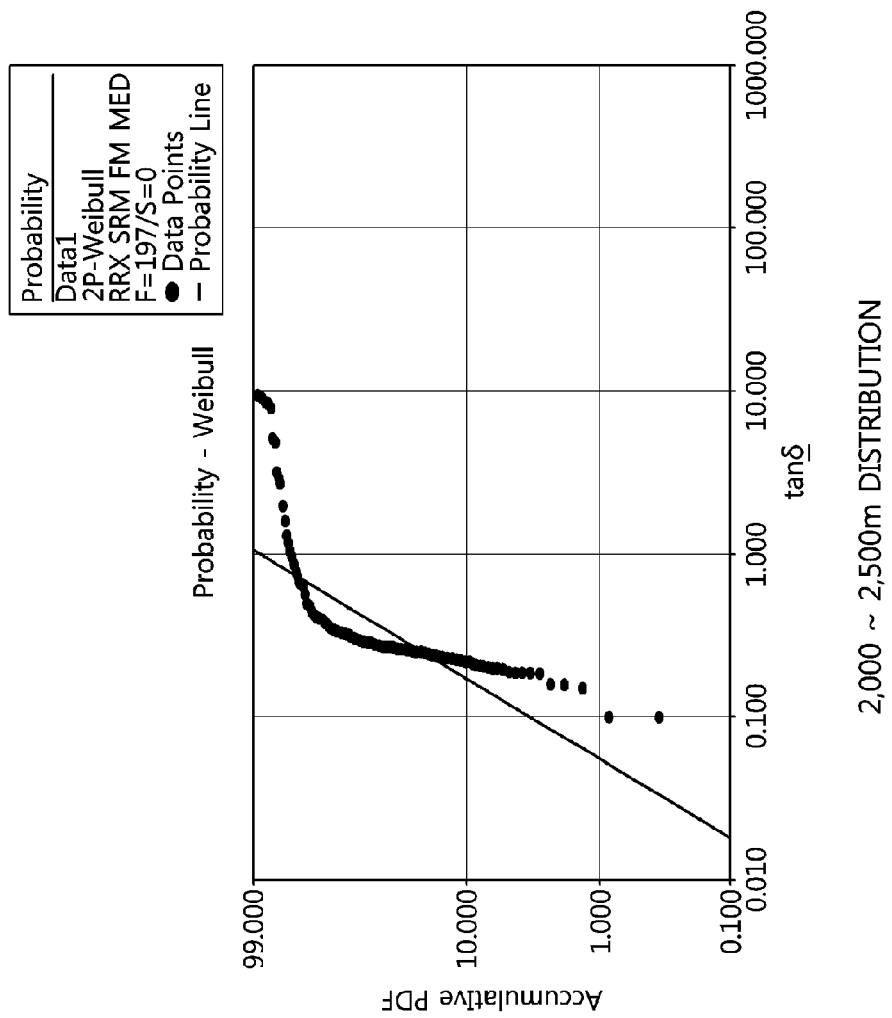
Figure 9:
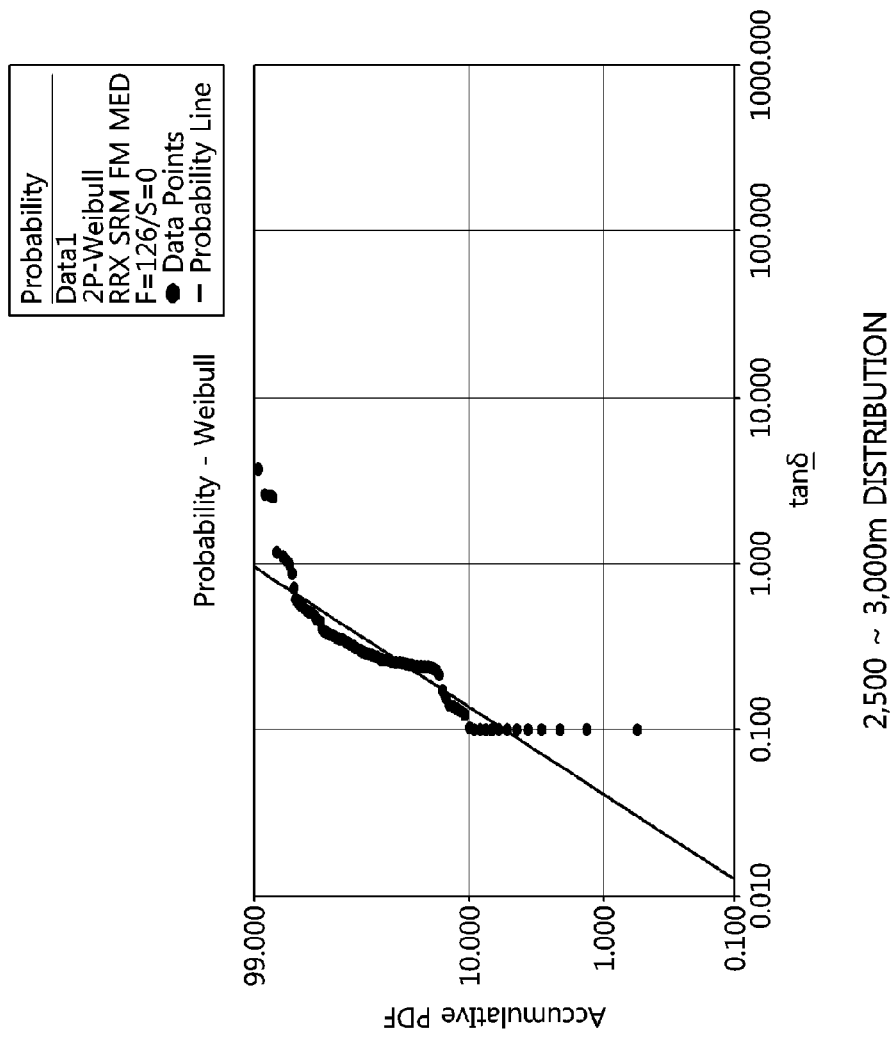
Figure 10:
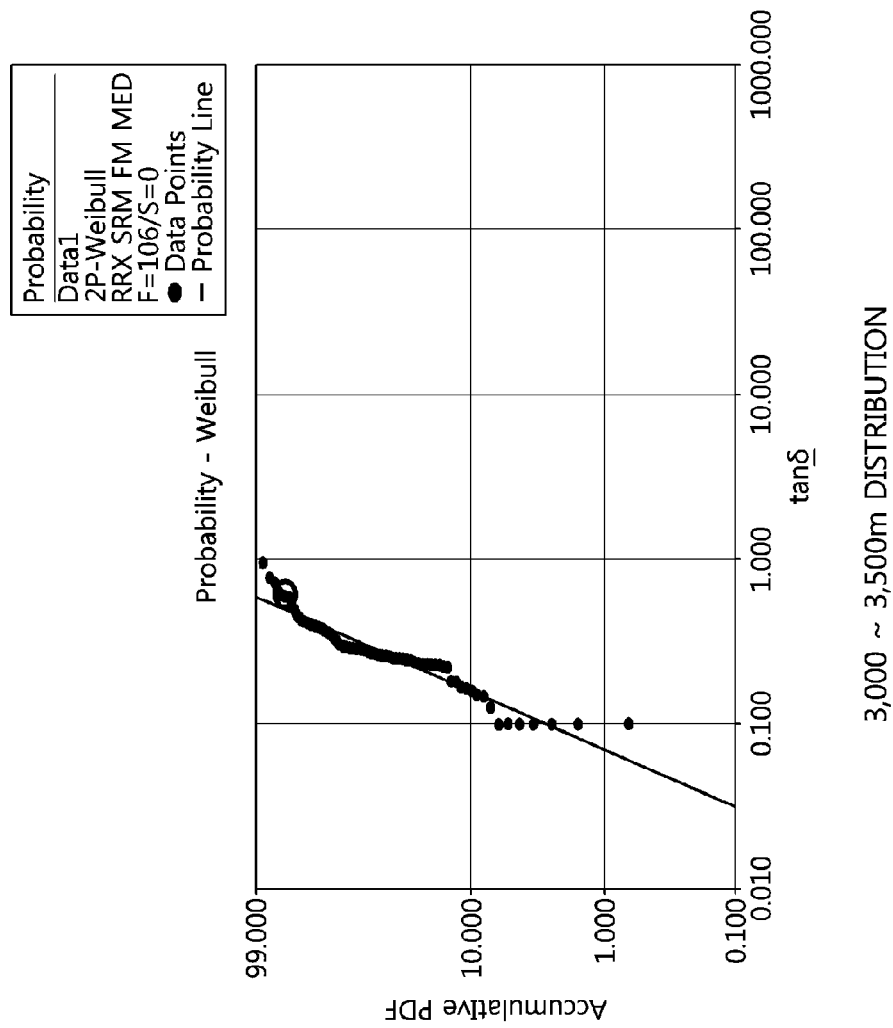
Figure 11:
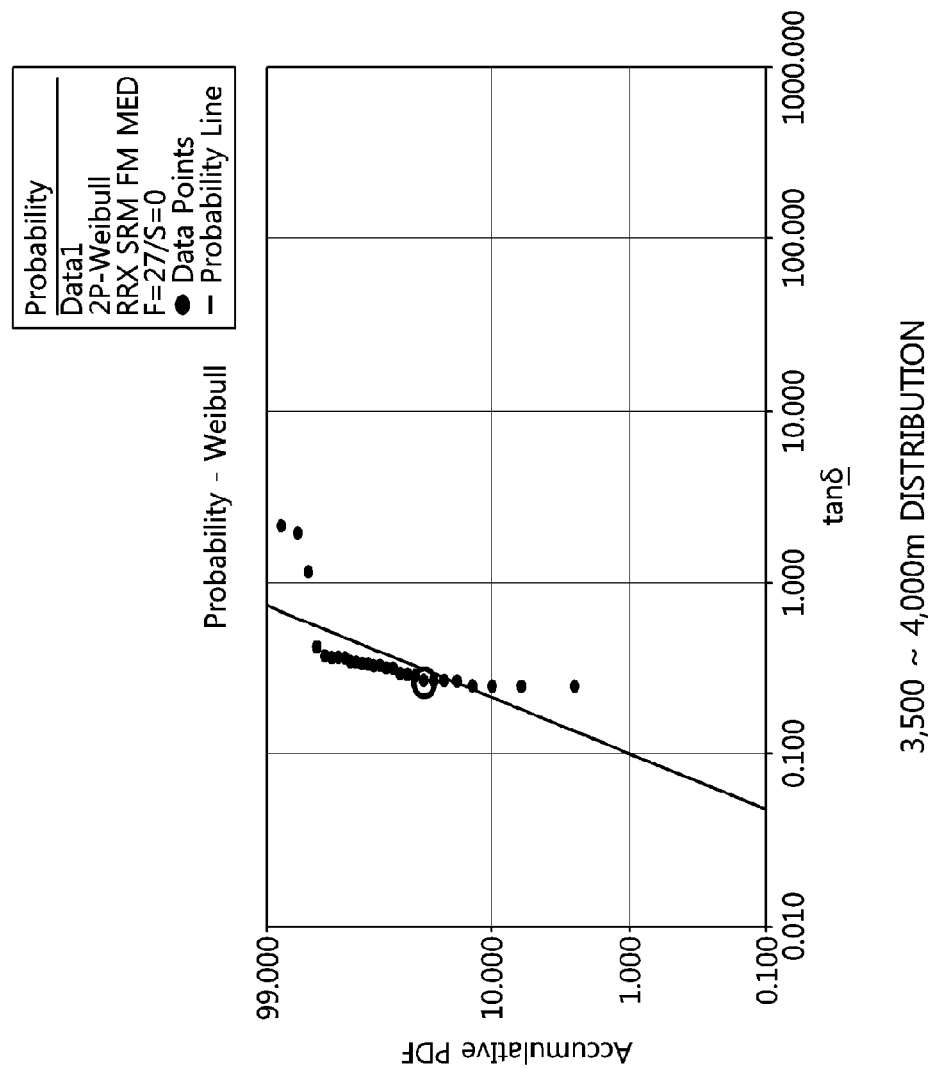
Figure 12:
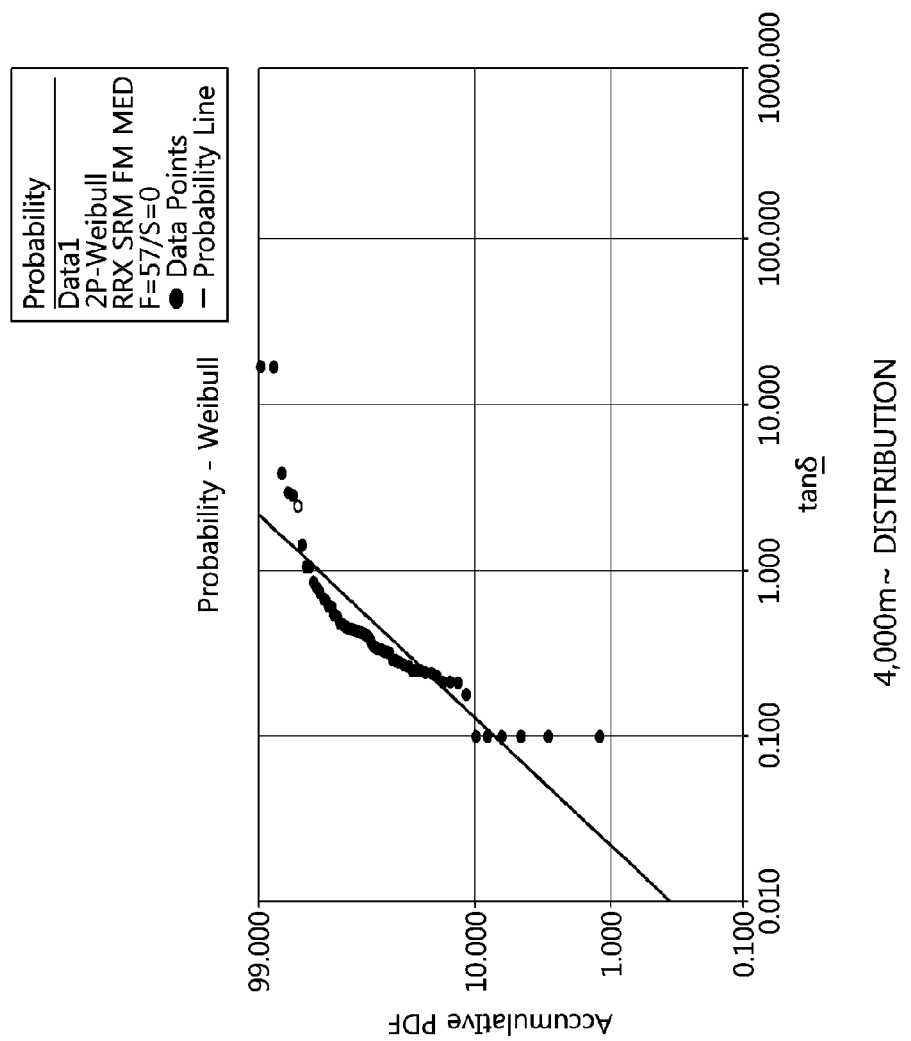

FIG. 3 illustrates an example of modeling VLF TD signal data of 1.5 Uo to an accumulative PDF using a Weibull distribution, FIG. 4 illustrates an example of modeling VLF TD signal data of 1.5 Uo in the range of 0 to 500 m to an accumulative PDF using a Weibull distribution, FIG. 5 illustrates an example of modeling VLF TD signal data of 1.5 Uo in the range of 500 to 1000 m to an accumulative PDF using a Weibull distribution, FIG. 6 illustrates an example of modeling VLF TD signal data of 1.5 Uo in the range of 1000 to 1500 m to an accumulative PDF using a Weibull distribution, FIG. 7 illustrates an example of modeling VLF TD signal data of 1.5 Uo in the range of 1500 to 2000 m to an accumulative PDF using a Weibull distribution, FIG. 8 illustrates an example of modeling VLF TD signal data of 1.5 Uo in the range of 2000 to 2500 m to an accumulative PDF using a Weibull distribution, FIG. 9 illustrates an example of modeling VLF TD signal data of 1.5 Uo in the range of 2500 to 3000 m to an accumulative PDF using a Weibull distribution, FIG. 10 illustrates an example of modeling VLF TD signal data of 1.5 Uo in the range of 3000 to 3500 m to an accumulative PDF using a Weibull distribution, FIG. 11 illustrates an example of modeling VLF TD signal data of 1.5 Uo in the range of 3500 to 4000 m to an accumulative PDF using a Weibull distribution, and FIG. 12 illustrates an example of modeling VLF TD signal data of 1.5 Uo at 4000 m or further to an accumulative PDF using a Weibull distribution.

FIG. 13 is a view illustrating data types classified by the data type classifying unit employed in the present invention.

Referring to FIG. 13, the VLF TD signal data is largely classified into a linear trend and a nonlinear pattern. The trend is further classified into a positive, negative, or constant pattern during 8 or more consecutive measurements. These 4 types of trends and patterns are correlated to each other in the view of degradation or structural modification of an insulator. In particular, at the time of the final occurrence of failure in a power cable related accident, the 4 types of trends and patterns are linked to a large change of the remaining life according to a complex degradation phenomenon and sharp reduction in reliability. In particular, in the case of a fatal accident, they are found in an increasing or decreasing pattern, and this change in measurement value is linked with a partial leakage phenomenon occurring right before the breakdown, which is deduced as a cause influencing the TD characteristics. At this point, circles in the drawing means data for the occurrence of failure, and a straight line slope means Weibull shape parameters.

Figure 14:
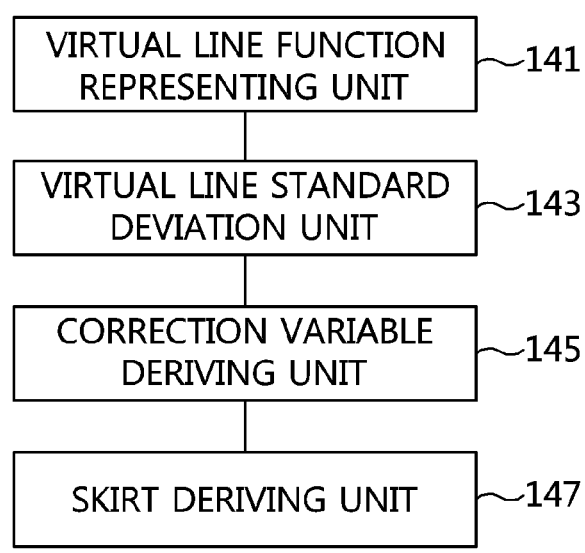
FIG. 14 is a view illustrating a detailed configuration of a quantity representing unit employed in the present invention.
Figure 15:
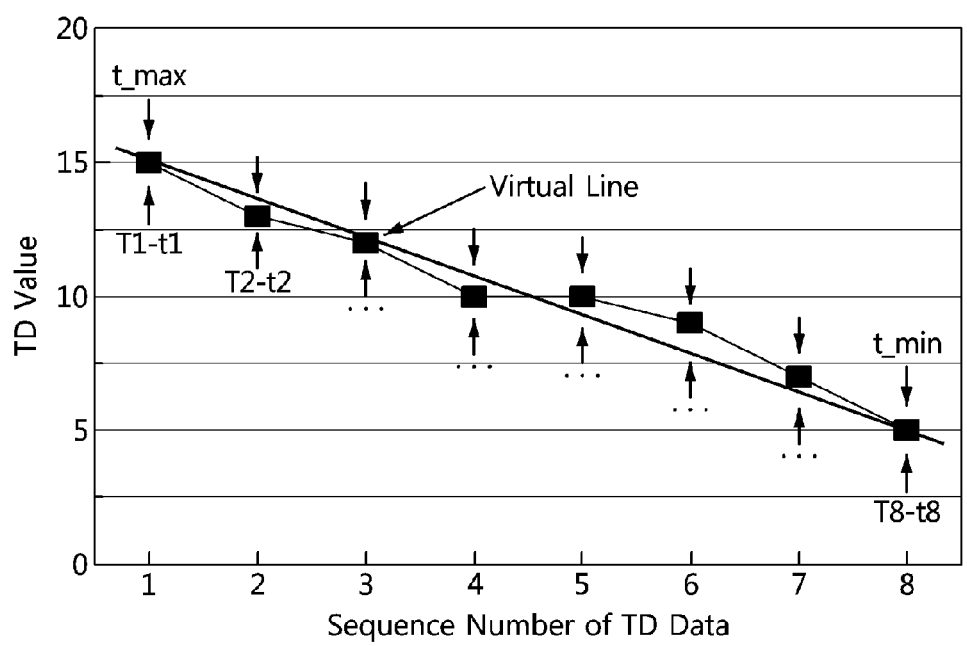
FIG. 15 is a view illustrating the fitting degree of, to a linear trend, VLF TD obtained by the quantity representing unit employed in the present invention.
Figure 16:
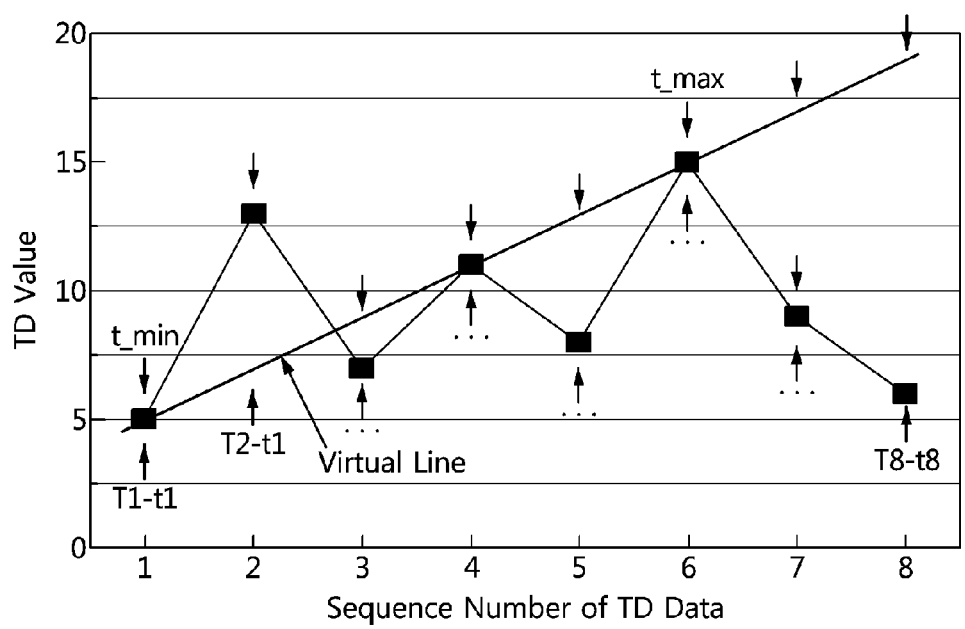
FIG. 16 is a view illustrating the fitting degree of, to a vibration pattern, VLF TD obtained by the quantity representing unit employed in the present invention.

FIG. 14 is a view illustrating the detailed configuration of the quantity representing unit employed in the present invention, FIG. 15 is a view illustrating the fitting degree of, to a linear trend, VLF TD obtained by the quantity representing unit employed in the present invention, and FIG. 16 is a view illustrating the fitting degree of, to a vibration pattern, VLF TD obtained by the quantity representing unit employed in the present invention.

Referring to FIG. 14, the quantity representing unit 140 according to the present invention includes a virtual line function representing unit 141, a virtual line standard deviation deriving unit 143, a correction variable deriving unit 145, and a SKIRT driving unit 147.

The virtual line function representing unit 141 generates a virtual line connecting a maximum value and a minimum value among the VLF TD signal data.

The virtual line function representing unit 141 generates the virtual line connecting the maximum value and the minimum value among eight VLF TD signal data tn. In addition, the virtual line has virtual points Tn respectively corresponding to the number of measurement times. At this point, the virtual line may be derived with the following Equation (1):

$$Y = \frac{t_{max} - t_{min}}{N_{max} - N_{min}} X + A_0 \quad (1)$$

$$A_0 = T_i - \left(\frac{t_{max} - t_{min}}{N_{max} - N_{min}}\right) \times i \quad (2)$$

where $t_{max}$: a maximum value among 8 actually measured values of tan δ, $t_{min}$: a minimum value among 8 actually measured values of tan δ, $N_{max}$: an x-axis value of $t_{max}$, $N_{min}$: an x-axis value of $t_{min}$, A0: a y-axis interception of the virtual line.

In Equations (1) and (2), Y represents x-axis VLF TD values of the virtual line corresponding to a measurement sequence, and the VLF TD values of Y corresponding to the measurement sequence 1, 2, . . . , n are represented as T1, T2, . . . , Tn. When having a linear trend, 8 VLF TD measurement values show that a plot of the actually measured VLF TD values matches the virtual line as shown in FIG. 14. However, when having an oscillating trend, 8 VLF TD measurement values show that a plot of the actually measured VLF TD values does not match the virtual line, as shown in FIG. 15. Accordingly, the fitting degree of the VLF TD to the virtual line may be quantified to a standard deviation for an arithmetic difference value between the virtual points Tn and tn, which is an actually measured VLF TD plot.

The virtual line standard deviation deriving unit 143 derives a virtual standard deviation $STDEV_{virtual}$ for the difference between the generated virtual line and the VLF TD signal data. At this point, the virtual line may be derived with the following $$STDEV_{virtualline} = \sqrt{\frac{\sum_{k=1}^{n}(|T_k - t_k| - m)^2}{n}} \quad (3)$$

where m: an average value of $m:|T_n-t_n|$.

Equation (3) expresses a standard deviation for the difference between the virtual points Tn respectively corresponding to the sequence number and the VLF TD measurement values to in order to represent the fitting degree of the measured VLF TD to the virtual line. It may be seen that as the standard deviation value of the virtual line is smaller, the measured VLF TD shows a high fitting degree to the virtual line and has a linear trend. On the contrary, a large standard deviation value shows that the measured VLF TD has an irregular nonlinear trend. Next, it is necessary to perform reflection of a VLF TD level in which the virtual line is positioned. This is because the risk levels are different in the case where a straight line of the virtual line is configured with low-leveled VLF TD and configured with high-leveled VLF TD. Accordingly, a correction equation is necessary to synthesize a VLF TD level, which is a virtual line Y, to the virtual standard deviation that represents the fitting degree to virtual line.

The correction variable deriving unit 145 derives a correction variable for correcting a standard deviation of the derived virtual line and the VLF TD signal data. At this point, the correction variable may be derived with the following Equation (4):

$$k = \frac{A_0}{\text{Log}(STDEV_{virtual} \times 1000)} \quad (4)$$

In Equation (4), the correction variable κ is a calculation equation for correcting standard deviations to have an identical tendency, since the magnitudes of 8 measured VLF TD values and the magnitudes of the standard deviations of the virtual line tend to conflict with each other (i.e. as the degradation become more severe, the VLF TD value becomes larger and the virtual DTD becomes smaller). In other words, the quantitative difference between data having measurement errors and normally measured data, and the quantitative difference between data corresponding to a fault area and data corresponding to a normal area may be increased by matching the fitting degree of the VLF TD values to the virtual line with the quantitative level of the VLF TD. At this point, since the scale of the virtual line standard deviation is very small, $STDEV_{virtual}$ is multiplied by the constant 10,000 in order to perform correction to the same level as A0.

The SKIRT deriving unit 147 derives a SKIRT by multiplying the derived correction variable by the slope of the virtual line. At this point, the SKIRT may be derived with the following Equation (5):

Skirt=degree of slope×k     (5)

where degree of slope=(tmax−tmin)/(Nmax−Nmin)

Equation (5) may define the SKIRT, which is a factor capable of finally quantifying the risk level of a cable, by multiplying the correction variable κ, obtained from Equations (1) to (4), by the virtual line slope.

At this point, it may be seen that the slope of the consecutively measured VLF TD group, the level in which the VLF TD group is positioned, and complexity, i.e. trends and patterns, must be reflected in the SKIRT, and proper correction is necessary for this. Accordingly, in the present invention, firstly, a mathematical model is presented in order to virtually represent the slope shown by the VLF TD as a virtual line, and secondly, the fitting degree of the measured VLF TD to the virtual line is quantified using the standard deviation. Thirdly, the correction variable κ is suggested, which is a mathematical module capable of giving a tendency to the data and simultaneously synthesizing the quantified the fitting degree and the level in which the VLF TD group is positioned. Finally, the magnitude and shape of VLF TD represented by the VLF TD group, and valid and invalid data with measurement errors may be represented with a single arithmetic value by synthesizing the quantified numerical value with the virtual line slope.

Figure 17:
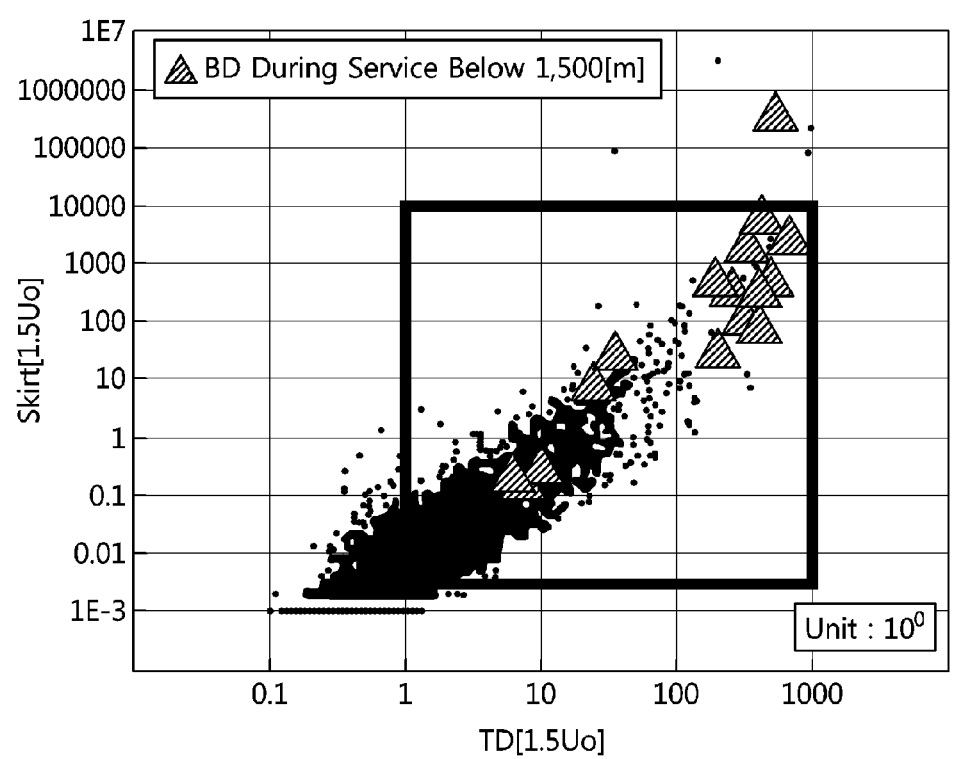
FIG. 17 is a view illustrating a dispersion distribution according to VLF TD signal data and VLF TD signal deviation, which is derived through a normalizing unit employed in the present invention.
Figure 19:
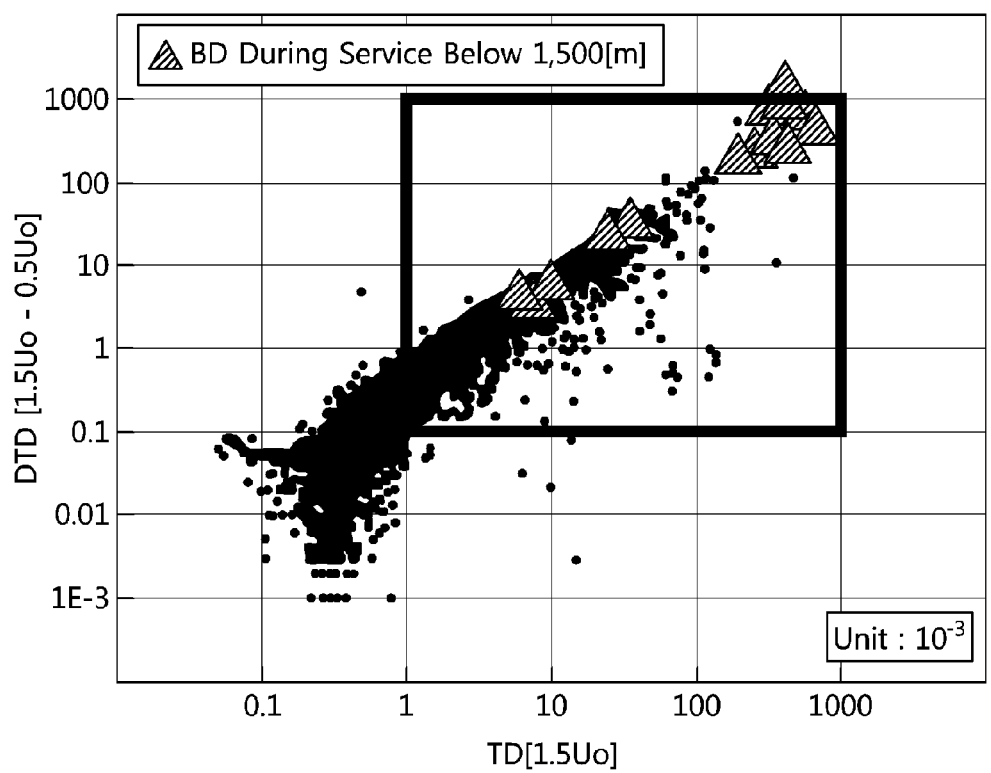
FIG. 19 is a view illustrating a dispersion distribution according to the signal data and a deviation slope, namely, a SKIRT of VLF TD, which is derived through a normalizing unit employed in the present invention.
Figure 20:
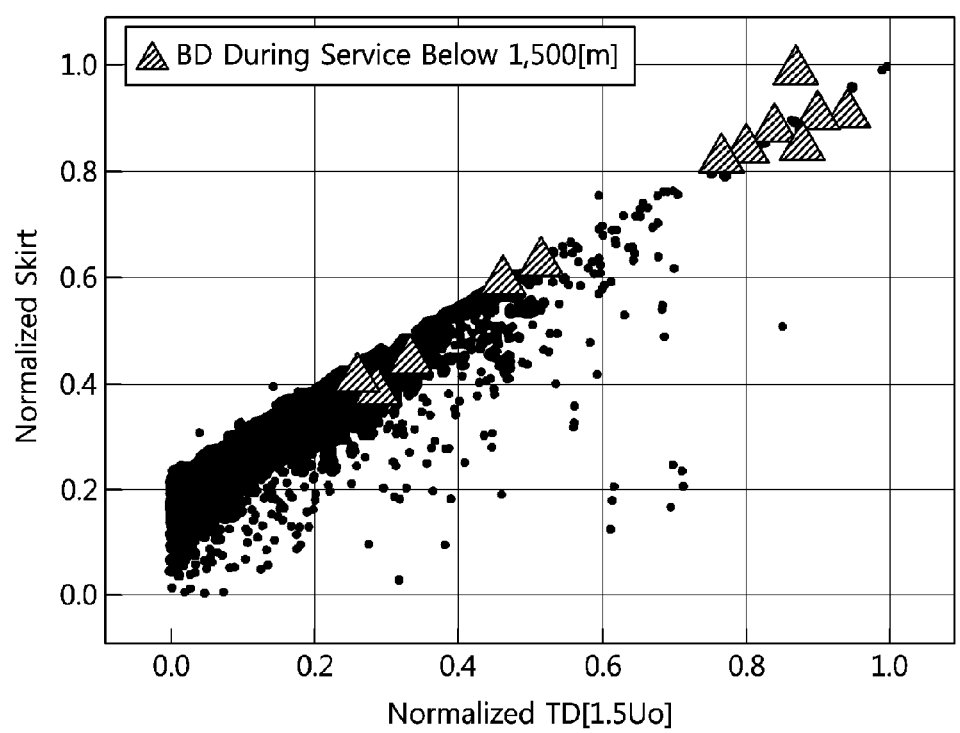
FIG. 20 is a normalized distribution according to the signal data and the SKIRT of VLF TD, which is derived through the normalizing unit employed in the present invention.

FIG. 17 is a view illustrating a dispersion distribution according to VLF TD signal data and DTD derived through the normalizing unit employed in the present invention, FIG. 18 is a normalized distribution according to VLF TD signal data and DTD derived through the normalizing unit employed in the present invention, FIG. 19 is a view illustrating a dispersion distribution according to the signal data and a SKIRT of VLF TD derived through the normalizing unit employed in the present invention, and FIG. 20 is a normalized distribution according to the signal data and the SKIRT of VLF TD derived through the normalizing unit employed in the present invention.

FIG. 17 is an exemplary dispersion distribution according to VLF TD signal data and DTD derived through the normalizing unit 150, and FIG. 18 is an exemplary normalization distribution for normalizing X- and Y-axes of the dispersion distribution illustrated in FIG. 18 from 0 to 1.

FIG. 19 is an exemplary dispersion distribution according to the VLF TD signal data and SKIRT of the VLF TD derived through the normalizing unit 150, and FIG. 20 is an exemplary normalization distribution for normalizing X- and Y-axes of the dispersion distribution illustrated in FIG. 19 from 0 to 1.

Figure 21:
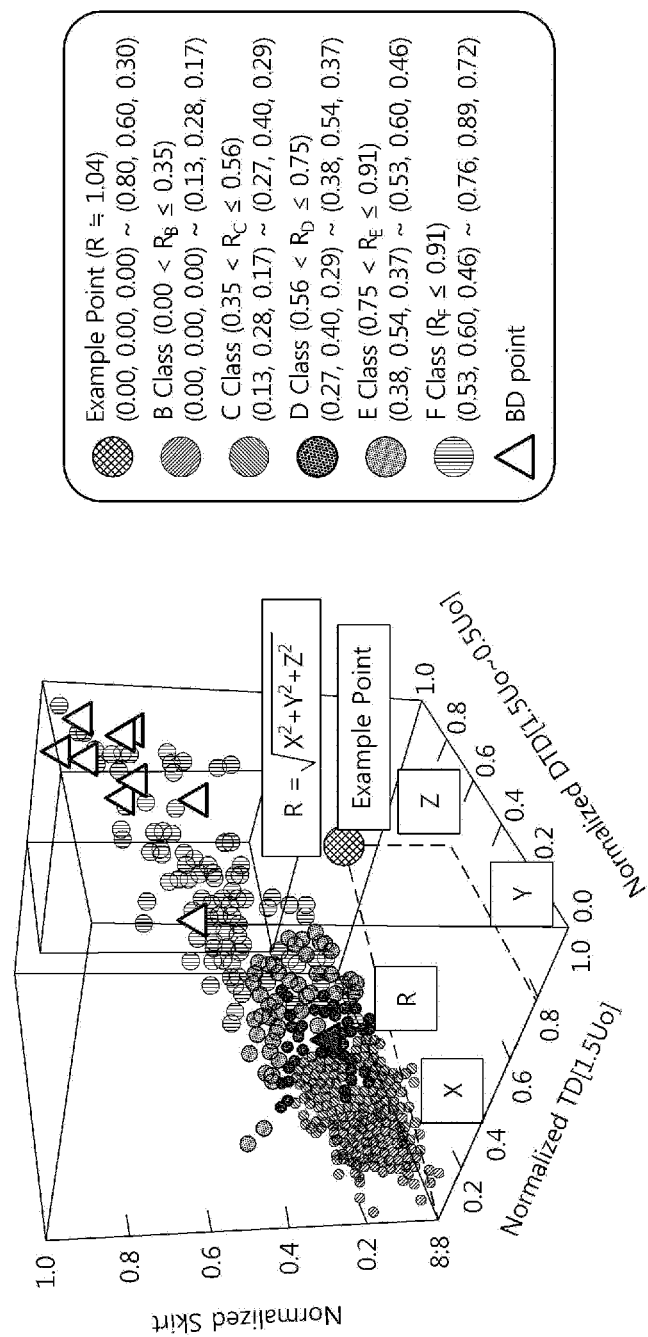
FIG. 21 is a view illustrating a 3D matrix constructed by a 3D configuring unit employed in the present invention.

FIG. 21 is a view illustrating a 3D matrix constructed by a 3D configuring unit employed in the present invention.

Referring to FIG. 21, the 3D matrix is a model that is normalized with 3 important normalized characteristics. Each 3D axis is configured with a normalized TD, normalized DTD, and normalized SKIRT. The 3D matrix is constructed as a cube model and is represented with the original point coordinates (0, 0, 0) and maximum coordinates (1, 1, 1). Accordingly, the maximum distance from the original point to a vertex is about 1.73 (i.e. sqrt($1^2+1^2+1^2$)). In the drawing, the point BD ▲ represents a breakdown accident reported during operation and has a high correlation with a distance from the original point. The small cube at the top portion is a period estimated as an area having a probability of 20% that a breakdown accident will occur within 2 years of operation. In addition, 6 preset risk levels are represented on the right side of the drawing. On the basis of this, in the risk level calculating unit, when a specific position vector is at (0.5, 0.5, 0.5), a position vector distance is calculated as Rd=SQRT($0.5^2+0.5^2+0.5^2$) to be about 0.85. Then, a cable level is approximately estimated as an E level. The E level means a state diagnosis result determined as the state where re-measurement is performed within 2 sis and an action therefor is taken. At present, KEPCO suggests 0.91 as an immediate replacement point. In other words, a level A is determined as a cable operable as long as a designed life, levels B and C are lines of interest but are determined as lines for which a proper re-measurement period and management plan are suggested after obtaining results of DE levels. For the Level D, the re-measurement period is set to about 4 to 5 years, and the level E is the period for accurately determining whether to replace the cable according to a change at the time of re-measurement.

Figure 22:
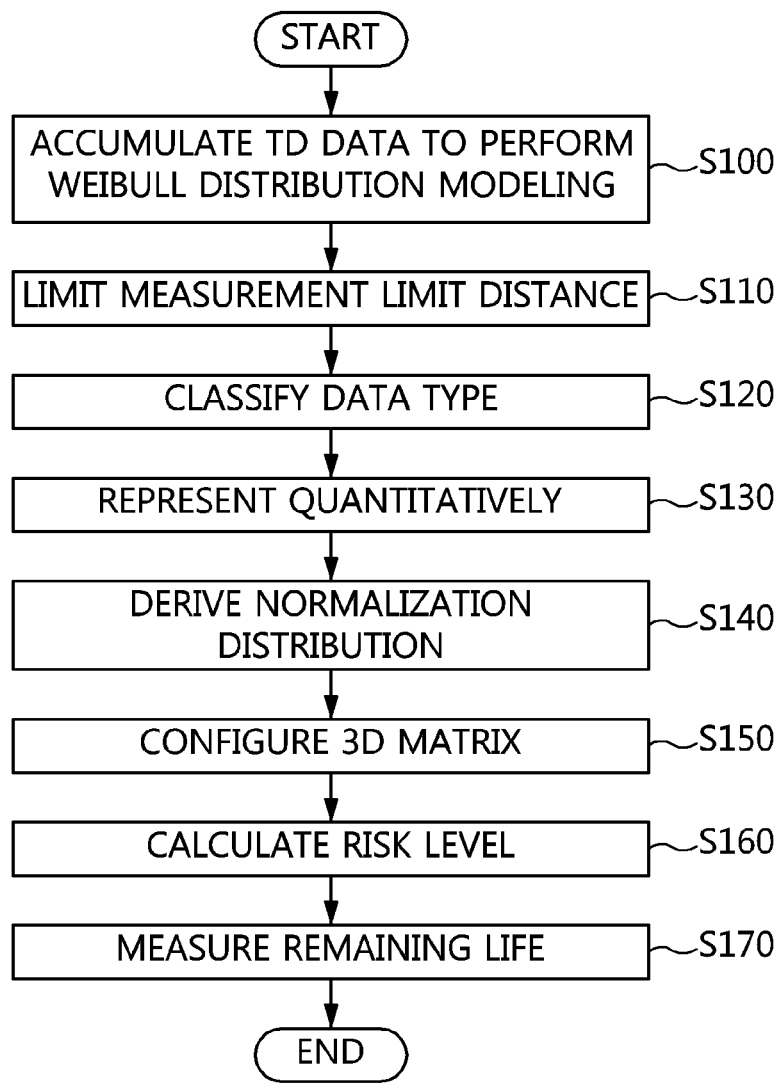
FIG. 22 is a flowchart illustrating a method for diagnosing the state of a power cable and measuring the remaining life thereof using VLF TD measurement data.

FIG. 22 is a flowchart illustrating a method for diagnosing the state of a power cable and measuring the remaining life thereof using VLF TD measurement data.

Referring to FIG. 22, the present invention pertains to a method for diagnosing the state of a power cable using the above described method for diagnosing the state of a power cable and measuring the remaining life thereof using the VLF TD measurement data, and measuring the remaining life thereof, and hereinafter, redundant description will be omitted.

Firstly, the VLF TD signal data, which is measured for each of a plurality of voltage levels applied to a power cable, is accumulated to perform a Weibull distribution modeling (step S100).

Then, a Weibull distribution for accumulated VLF TD signal data is compared with a preset Weibull distribution for the accumulated VLF TD signal data for each measurement distance to limit a measurement limit distance (step S110).

Then, the VLF TD signal data is classified for each type on the basis of the limited measurement limit distance (step S120). At step S120, the VLF TD signal data is classified into a trend and pattern, the trend is further classified into either a linear or non-linear type, and the pattern is further classified into any one of a positive, negative, constant, and oscillating type.

Then the classified types are represented quantitatively (step S130). At step S130, a virtual function is generated, a virtual standard deviation is derived, a correction variable is derived, and a SKIRT is derived from the classified types.

Then the VLF TD signal data and DTD thereof, and the VLF TD signal data and a SKIRT thereof are represented as dispersion distributions, and each of the dispersion distributions is normalized to drive a normalization distribution (step S140). At step S140, the normalized distribution, which normalizes the X- and Y-axes of each dispersion distribution from 0 to 1, is derived.

Then, the derived normalization distribution is constructed to a 3D matrix (step S150). At step S150, the 3D matrix is constructed with an X-axis taken for VLF TD data, a Y-axis taken for DTD, and a Z-axis taken for a normalized SKIRT.

Then, the risk level of a power cable is calculated as one of preset risk levels on the basis of the distance measured in the 3D matrix (step S160).

Then, the remaining life of the power cable is measured based on the 3D matrix (step S170). At step S170, at least any one of the cost of power cable replacement work, reference failure probability, position matching with the failure density according to the reference failure probability, degradation speed, margin rate, allowance rate, failure reliability level, and fault determination time is calculated to measure the remaining life.

In detail, firstly, in order to derive the power replacement work cost, the remaining life measuring unit derives a cable replacement work cost per unit period based on construction cost (₩), an average interruption power amount per failure case (kWh), a selling price per kWh (₩), a social loss cost per kWh (₩), and an average cable replacement completion period (months). At this point, the cable replacement completion period means the entire completion period, from field survey and design to field facility replacement.

Then, the equation for calculating the reference failure probability is as the following Equation (6):

$$\text{reference } f(t) = \frac{\text{replacement cost } (A)}{\text{replacement cost } (A) + \text{loss cost}}[\%] \quad (6)$$

Then, the equation for calculating the position matching with the failure density according to a reference failure probability is as the following Equation (7):

reference $R=R$ of position where reference $f(t)$ and failure density $f(R)$ are matched (7)

Here, from the 3D matrix data distribution, the failure density f(t) of the occurrence of failure data (t) over all of the data (T) included in a closed surface for each step of a distance Index R and a closed surface of R=1.73 is derived, and the distance Index R at which reference f(t) matches the failure density f(t) according to the distance Index R is derived.

Then, the equation for calculating a degradation speed is as the following Equations.

Equation (8) pertains to the case where the distance Index R1 according to initial diagnosis and R2 through the re-diagnosis are secured.

$$V_R = \frac{R_2 - R_1}{\text{measurement time difference (month)}} \quad (8)$$

Equation (9) pertains to the case where, as in the diagnosis case, the distance Index R is close to the reference R.

$$V_R = \frac{R_1}{\text{lapse of time period after installment (month)} - 156} \quad (9)$$

Then, the method for setting the margin rate is as in the following Equation (10):

$$x\% = \frac{V_R \times \text{facility replacement completion period } (E)}{\text{life interface plane } (R = 1.27)} \times 100 \quad (10)$$

Then, the method for setting an allowance rate conforms to policy determination, and a default is set so that the distance Index R at which the failure data starts to be obtained becomes the reference R.

Then, the method for determining the failure reliability level F(t) is as the following Equation (11):

$$F(t) = 100\% - x\% - y\% \quad (11)$$

Then, the method for calculating the fault determination distance Index R is as the following Equation (12):

replacement determination distance $R$=reference $R \times F(t)$ (12)

In this way, the present invention may present a statistical basis for a cable degradation determination criterion and a logical basis using a probability distribution by diagnosing the state of a power cable using a VLF TD signal.

In addition, there are effects of predicting the remaining life of a power cable and predicting the time of failure occurrence based on statistical probability by measuring the remaining life of the power cable using a 3D matrix in which reproducible diagnosis of the state of the power cable is realized.

Meanwhile, the present invention is not limited to the above-described embodiments, and may be changed and modified without departing from the gist of the present invention, and it should be understood that the technical spirit of such changes and modifications also belong to the scope of the accompanying claims.

The invention claimed is:

1. An apparatus for diagnosing a state of a power cable and maintaining the power cable, the apparatus comprising:
   a Weibull modeling unit performing Weibull distribution modeling by accumulating VLF tan delta (TD) signal data measured for each of a plurality of voltage levels applied to a power cable;
   a distance limiting unit comparing a Weibull distribution for accumulated VLF TD signal data with a preset Weibull distribution for the accumulated VLF TD signal data for each measurement distance to limit a measurement limit distance;
   a data type classifying unit classifying the VLF TD signal data into a type on a basis of the limited measurement limit distance, the type comprising a trend and a pattern;
   a quantity representing unit quantitatively representing the classified type;
   a normalization unit representing, to dispersion distributions, the VLF TD signal data and VLF TD signal deviation (DTD), and the VLF TD signal data and a slope of deviation (SKIRT) derived from the quantity representing unit, and normalizing the dispersion distributions to derive normalization distributions;
   a 3D constructing unit constructing a 3D matrix with the derived normalization distributions;
   a risk level calculating unit calculating a risk level of the power cable as one of preset risk levels based on a distance measured in the 3D matrix; and
   a life measuring unit determining a maintenance action for the power cable based on the calculated risk level, the maintenance action being one selected from a group consisting of replacement of the power cable, re-measurement of the VLF TD signal data, and setting a time for re-measurement of the VLF TD signal data.

2. The apparatus according to claim 1, wherein the trend is classified into linear and non-linear patterns, the linear pattern being classified into positive, negative, and constant types, and the non-linear pattern being classified into an oscillating type.

3. The apparatus according to claim 1, wherein the quantity representing unit comprises:
   a virtual line function representing unit generating a virtual line connecting a maximum value and a minimum value among the VLF TD signal data;
   a virtual line standard deviation deriving unit deriving a virtual standard deviation $STDEV_{virtual}$ for the generated virtual line and the VLF TD signal data;
   a correction variable deriving unit deriving a correction variable for correcting the derived virtual line standard deviation and the VLF TD signal data; and
   a SKIRT deriving unit deriving a SKIRT by multiplying the derived correction variable by a virtual line slope.

4. The apparatus according to claim 3, wherein the correction variable deriving unit corrects the fitting degree of a numerical value of the VLF TD signal data to the virtual line and a quantitative level of the VLF TD signal data.

5. The apparatus according to claim 1, wherein the normalization unit derives a normalization distribution for normalizing values of X- and Y-axes of the dispersion distribution of the VLF TD signal data and DTD, and values of X- and Y-axes of the dispersion distribution of the VLF TD signal data and SKIRT into normalized values from 0 to 1.

6. The apparatus according to claim 1, wherein the 3D constructing unit constructs the 3D matrix with an X-axis taken as a normalized VLF TD data, a Y-axis taken as a normalized DTD, and Z-axis taken as a normalized SKIRT.

7. The apparatus according to claim 1, wherein the risk level calculating unit calculates a distance to a specific position vector (x, y, z) from coordinates (0, 0, 0) of an original point of the 3D matrix, and calculates a risk level of the power cable on a basis of the calculated result.

8. The apparatus according to claim 7, wherein the preset risk level is classified and set to a plurality of risk levels in correspondence to a present distance range.

9. The apparatus according to claim 1, wherein the life measuring unit measures a remaining life of the power cable on a basis of the 3D matrix.

10. The apparatus according to claim 9, wherein the remaining life measuring unit calculates at least any one of a cost of power cable replacement work, reference failure probability, position matched with a failure density according to the reference failure probability, degradation speed, margin rate, allowance rate, failure reliability level, and fault determination time to measure the remaining life of the power cable.

11. A method for diagnosing a state of a power cable and maintaining the power cable, the method comprising:
performing Weibull distribution modeling by accumulating VLF tan delta (TD) signal data measured for each of a plurality of voltages applied to a power cable;
comparing a Weibull distribution for accumulated VLF TD signal data with a preset Weibull distribution for the accumulated VLF TD signal data for each measurement distance to limit a measurement limit distance;
classifying the VLF TD signal data into a type on a basis of the limited measurement limit distance, the type comprising a trend and a pattern;
quantitatively representing the classified type;
representing the VLF TD signal data and DTD, and the VLF TD signal data and a SKIRT as dispersion distributions, and normalizing the dispersion distributions to drive normalization distributions;
constructing a 3D matrix with the derived normalization distributions; and
calculating a risk level of the power cable as one of preset risk levels on a basis of a distance measured in the constructed 3D matrix;
determining a maintenance action for the power cable based on the calculated risk level, the maintenance action being one selected from a group consisting of replacement of the power cable, re-measurement of the VLF TD signal data, and setting a time for re-measurement of the VLF TD signal data.

12. The method according to claim 11, wherein the trend is classified into linear and non-linear pattern, the linear pattern being classified into positive negative, and constant types, and the non-linear pattern being classified into an oscillating type.

13. The method according to claim 11, wherein quantitatively representing the classified type comprises:
generating a virtual line connecting a maximum value and a minimum value among the VLF TD signal data;
deriving a virtual standard deviation $STDEV_{virtual}$ for the generated virtual line and the VLF TD signal data;
deriving a correction variable for correcting the derived virtual line standard deviation and the VLF TD signal data; and
deriving a SKIRT by multiplying the derived correction variable by a virtual line slope.

14. The method according to claim 11, wherein representing the VLF TD signal data and DTD, and the VLF TD signal data and a SKIRT as dispersion distributions, and normalizing the dispersion distributions to drive normalization distributions comprises deriving a normalization distribution for normalizing X- and Y-axes of the dispersion distribution of VLF TD signal data and the DTD, and the dispersion distribution of the VLF TD signal data and the SKIRT into normalized values of 0 to 1.

15. The method according to claim 11, wherein constructing the 3D matrix with the derived normalization distributions comprises constructing the 3D matrix with an X-axis taken as a normalized VLF TD data, a Y-axis taken as a normalized VLF TD signal deviation, and a Z-axis taken as a normalized SKIRT.

16. The method according to claim 11, wherein calculating the risk level of the power cable as one of preset risk levels on the basis of a distance measured in the constructed 3D matrix comprises calculating a distance to a specific position vector (x, y, z) from coordinates (0, 0, 0) of an original point of the 3D matrix, and calculating a risk level of the power cable on a basis of the calculated result.

17. The method according to claim 11, further comprising measuring a remaining life of the power cable on a basis of the 3D matrix, after the calculating the risk level of the power cable as one of preset risk levels on a basis of a distance measured in the constructed 3D matrix.

18. The method according to claim 17, wherein measuring the remaining life of the power cable on the basis of the 3D matrix comprises calculating at least any one of a cost of power cable replacement work, reference failure probability, position matched with a failure density according to the reference failure probability, degradation speed, margin rate, allowance rate, failure reliability level, and fault determination time to measure the remaining life of the power cable.

* * * * *